United States Patent
Wu et al.

(10) Patent No.: US 12,283,340 B2
(45) Date of Patent: Apr. 22, 2025

(54) METHOD FOR CONTROLLING SENSE AMPLIFIER AND CONTROL DEVICE USING THE SAME

(71) Applicant: Taiwan Semiconductor Manufacturing Company, Ltd., Hsinchu (TW)

(72) Inventors: Jui-Jen Wu, Hsinchu (TW); Jen-Chieh Liu, Hsinchu (TW); Yi-Lun Lu, New Taipei (TW); Win-San Khwa, Taipei (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 343 days.

(21) Appl. No.: 17/886,423

(22) Filed: Aug. 11, 2022

(65) Prior Publication Data
US 2024/0055031 A1  Feb. 15, 2024

(51) Int. Cl.
*G11C 7/08* (2006.01)
*G11C 7/10* (2006.01)

(52) U.S. Cl.
CPC .............. *G11C 7/08* (2013.01); *G11C 7/106* (2013.01); *G11C 7/1063* (2013.01)

(58) Field of Classification Search
CPC ........................................................ G11C 7/08
USPC ........................................................ 365/205
See application file for complete search history.

(56) References Cited

U.S. PATENT DOCUMENTS

| | | | |
|---|---|---|---|
| 11,264,081 B1* | 3/2022 | Yu | G11C 11/4074 |
| 2014/0247672 A1* | 9/2014 | Wu | G11C 11/419 365/104 |
| 2015/0055426 A1* | 2/2015 | Chen | G11C 7/065 365/207 |
| 2022/0084590 A1* | 3/2022 | Jang | G11C 7/08 |
| 2022/0406386 A1* | 12/2022 | Chen | G11C 16/28 |

* cited by examiner

*Primary Examiner* — Muna A Techane
(74) *Attorney, Agent, or Firm* — JCIPRNET

(57) ABSTRACT

The disclosure provides a method for controlling a sense amplifier. The control device includes a latch circuit and a control circuit. The latch circuit receives a plurality of memory data signals from the sense amplifier, wherein the latch circuit respectively generates a plurality of reference data signals based on the plurality of memory data signals. The control circuit is coupled to the latch circuit, provides an enable signal to the sense amplifier in response to a pass gate signal of the sense amplifier, and stops providing the enable signal in response to at least one of the plurality of reference data signals, wherein the enable signal controls a sensing period of the sense amplifier.

17 Claims, 5 Drawing Sheets

METHOD FOR CONTROLLING SENSE AMPLIFIER AND CONTROL DEVICE USING THE SAME

BACKGROUND

When reading the memory data of a memory cell, the memory cell needs to be connected to a sense amplifier via, for example, a column multiplexer (MUX). The sense amplifier needs an enable signal (referred to as SAEN) as the starting signal to trigger the sense amplifier start to amplify the small signal difference associated to the memory data stored in the memory cell.

When the sense amplifier starts to amplify the small signal difference, a delay circuit is generally used to keep the enable signal for a period of a time (referred to as $t_{SAE}$) until the amplified data is latched at the output stage.

Conventionally, the enable signal (i.e., SAEN) roust be maintained long enough to ensure the data to be properly latched in the output stage. However, if $t_{SAE}$ is too long, it leads to long sensing period, which may degrade the speed and/or efficiency of reading memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
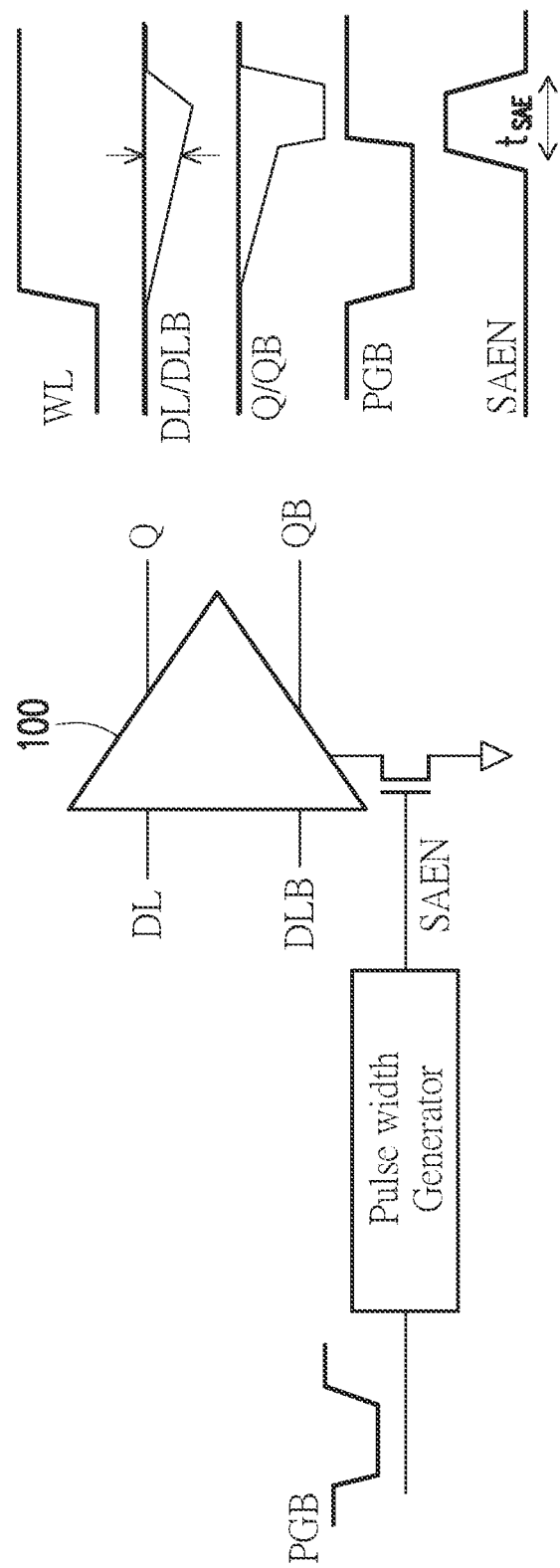
FIG. 1 shows an operating mechanism of sa sense amplifier (SA).

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

See FIG. 1, which shows an operating mechanism of a sense amplifier (SA). In FIG. 1, the sense amplifier 100 can be configured with data lines DL and DLB for connecting to the bit lines of a memory cell via the column multiplexer.

In one embodiment, when the voltage of the word line WL of the memory cell is pulled high, the pass gate signal PGB can be used to trigger a voltage developing phase PH1 by being pulled low. In this case, the voltages of the data lines DL and DLB would be developed according to the memory data stored in the memory cell, such that the voltage difference between the voltages of the data lines DL and DLB would be increased. Along with the increasing voltages of the data lines DL and DLB, the memory data signals Q and QB of the sense amplifier 100 are increasing accordingly.

When the enable signal SAEN (whose duration (i.e., $t_{SAE}$) is determined based on the pass gate signal PGB and the pulse width generator) is pulled high to trigger the sense amplifier 100 to start a sensing period PH2, the sense amplifier 100 starts to amplify the small signal difference between the memory data signals Q and QB of the sense amplifier 100 for the sense amplifier 100 to latch the memory data signals Q and QB as output data.

As mentioned in the above, the $t_{SAE}$ needs to be long enough for the sense amplifier 100 to latch the output data. However, if $t_{SAE}$ is too long, it leads to long sensing period, which may degrade the speed and/or efficiency of reading memory cells.

Figure 2:
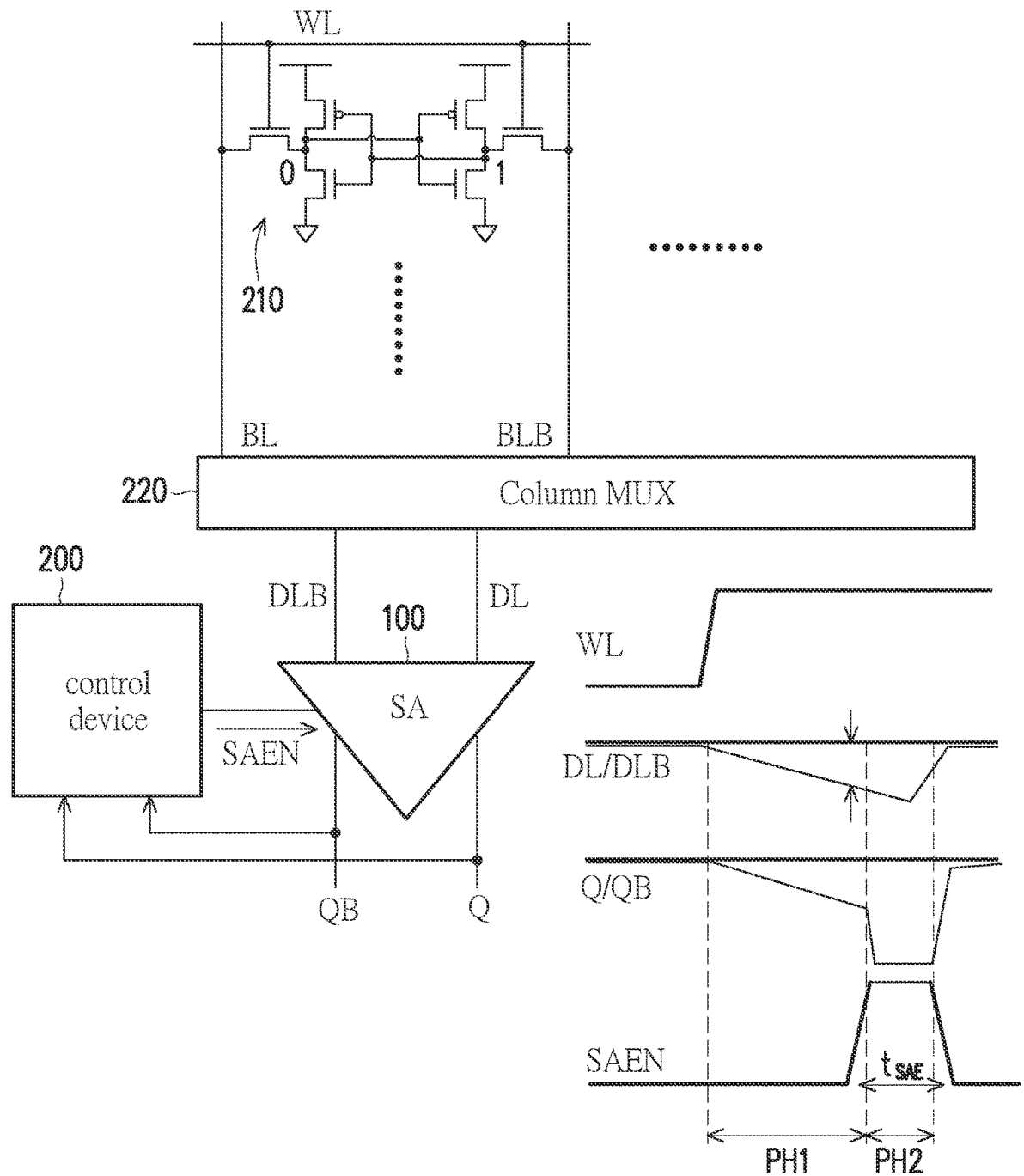
FIG. 2 shows a schematic diagram of the controlling mechanism of the control device according to an embodiment of the disclosure.

See FIG. 2, which shows a schematic diagram of the controlling mechanism of the control device according to an embodiment of the disclosure. In FIG. 2, the control device 200 for controlling the sense amplifier 100 can be coupled to the sense amplifier 100 for providing the enable signal SAEN and automatically stops providing the enable signal SAEN according to the memory data signals Q and QB.

For example, when the sense amplifier 100 is coupled to the memory cell 210 (which may be a 6T-SRAM (Static Random Access Memory with 6 transistors) cell) via the column MUX 220, the bit lines BL and BLB of the memory cell 210 can be respectively coupled to the data lines DL and DLB of the sense amplifier 100.

In FIG. 2, the principles of the variations of the voltages of word line WL of the memory cell 210, the data lines DL/DLB, the memory data signals Q/QB can be referred to the descriptions of FIG. 1. In the embodiment, the difference between FIG. 1 and FIG. 2 is that the $t_{SAE}$ in FIG. 1 is determined by the pulse width generator programmed by the designer, but the $t_{SAE}$ in FIG. 2 is automatically determined by the control device 200 based on the memory data signals Q and QB. Detailed discussions would be provided in the following.

Figure 3:
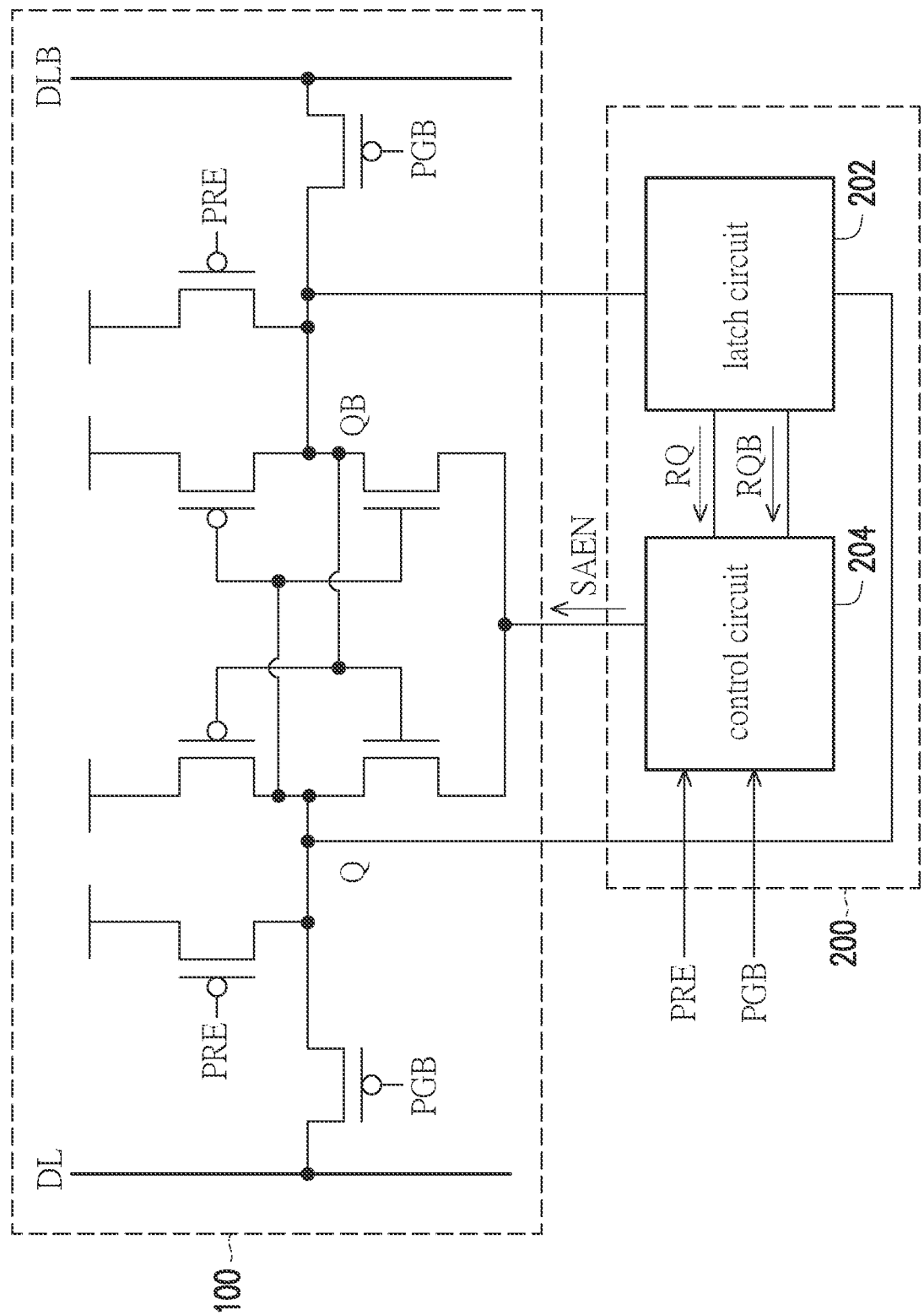
FIG. 3 shows a schematic diagram of the control device and the sense amplifier according to FIG.

See FIG. 3, which shows a schematic diagram of the control device and the sense amplifier according to FIG. 2. In FIG. 3, the structure of the exemplary sense amplifier 100 can be as shown in FIG. 3, and the details of the structure of the sense amplifier can be referred to the related prior art.

In the embodiment, the control device 200 includes a latch circuit 202 and a control circuit 204. In one embodiment, the latch circuit 202 is coupled to the sense amplifier 100 for receiving the memory data signals Q and QB from the sense amplifier 100. The control circuit 204 is coupled to the latch circuit 202 and the sense amplifier 100.

In one embodiment, the control circuit 204 provides the enable signal SAEN to the sense amplifier 100 in response to the pass gate signal PGB of the sense amplifier 100. Specifically, the control circuit 204 starts to provide the enable signal SAEN at an end of the voltage developing phase PH1 to start the sensing period PH2. In the sensing period PH2, the sense amplifier 100 starts to amplify the small signal difference between the memory data signals Q and QB.

In one embodiment, the latch circuit 202 receives the memory data signals Q and QB from the sense amplifier 100 and respectively generates a plurality of reference data signals RQ and RQB based on the memory data signals Q and QB.

Specifically, the latch circuit 202 determines whether at least one of the memory data signals Q and QB reaches a first voltage state (e.g., the voltage corresponding to a logic 0 or low voltage state) in the sensing period PH2. When the latch circuit 202 determines that at least one of the memory data signals Q and QB reaches the first voltage state, the latch circuit 202 inverts the at least one of the memory data signals Q and QB as at least one of the reference data signals RQ and RQB.

In one embodiment, the memory data signals Q and QB can be precharged to VDD before the voltage developing phase PH1, and one of the memory data signals Q and QB can be gradually decreased during the voltage developing phase PH1. At the beginning of the sensing period PH2, since the small signal difference between the memory data signals Q and QB would be small, the voltages of the memory data signals Q and QB would be determined to be high or logic 1, even though the data corresponding the data lines DL and DLB are complementary to each other (e.g., one of which is logic 0 and the other is logic 1). Along with the amplification of the sense amplifier 100 on the memory data signals Q and QB, one of the memory data signals Q and QB would reach the first voltage state, such that the corresponding one of the reference data signals RQ and RQB would become a second voltage state (e.g., the voltage corresponding to a logic 1 or high voltage state).

For example, if the data corresponding to the data line DL is logic 0, the voltage of the corresponding memory data signal Q would be would be determined to be high or logic 1 at the beginning of the sensing period PH2, such that the latch circuit 204 would determine the corresponding reference data signal RQ (which is inverted to the memory data signal Q) to be low or logic 0. However, the voltage of the memory data signal Q would be decreased in the sensing period PH2 after being amplified. When the voltage of the memory data signal Q reaches the first voltage state, the latch circuit 202 would determine the corresponding reference data signal RQ to be the second voltage state (e.g., the voltage corresponding to a logic 1 or high voltage state).

In brief, at the beginning of the sensing period PH2, both of the reference data signals RQ and RQB would be determined to be in the first voltage state, but one of the reference data signals RQ and RQB would become the second voltage state when the small signal difference between the memory data signals Q and QB is large enough. When the small signal difference between the memory data signals Q and QB is large enough, it represents that the memory data signals Q and QB are ready to be latched as the output data of the sense amplifier 100. In one embodiment, the control circuit 204 stops providing the enable signal SAEN to the sense amplifier 100 in response to the at least one of the reference data signals RQ and RQB. In one embodiment, the at least one of the reference data signals RQ and RQB is the one in the second voltage state.

For example, if the reference data signal RQ is determined by the latch circuit 202 as becoming the second voltage state during the amplification of the sensing amplifier 100, the control circuit 204 would stop providing the enable signal SAEN to the sense amplifier 100 in response to the reference data signal RQ being in the second voltage state.

For another example, if the reference data signal RQB is determined by the latch circuit 202 as becoming the second voltage state during the amplification of the sensing amplifier 100, the control circuit 204 would stop providing the enable signal SAEN to the sense amplifier 100 in response to the reference data signal RQB being in the second voltage state.

As mentioned before, the enable signal SAEN controls the sensing period PH2 of the sense amplifier 100. Therefore, the when the control circuit 204 stop providing the enable signal SAEN to the sense amplifier, the sensing period PH2 of the sense amplifier 100 would be terminated, i.e., the sense amplifier 100 would stop the amplification. In one embodiment, a duration of the enable signal SAEN (i.e., $t_{SAE}$) is equal to the sensing period PH2 of the sense amplifier 100.

Accordingly, the control device 200 provided in the disclosure can automatically terminate the sensing period when the memory data signals Q and QB are suitable to be latched as the output data of the sense amplifier 100. Therefore, the speed and efficiency of reading memory cells can be improved.

Figure 4:
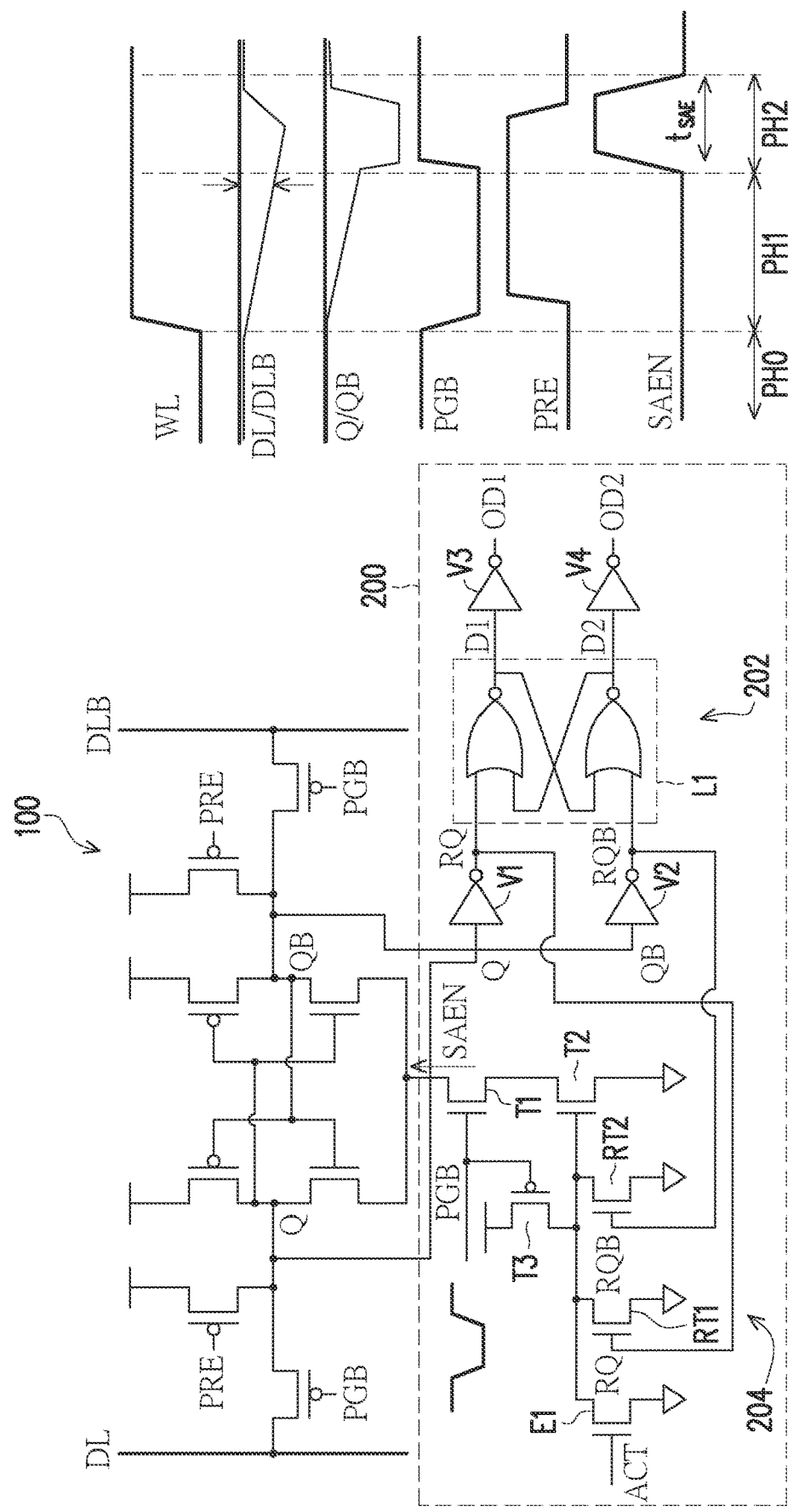
FIG. 4 stows a detailed structure of the control device according to FIG. 2 and FIG. 3.

See FIG. 4, which shows a detailed structure of the control device according to FIG. 2 and FIG. 3. In FIG. 4, the latch circuit 202 includes a first inverter V1, a second inverter V2, an SR latch L1, a third inverter V3, and a fourth inverter V4. The first inverter V1 receives the memory data signal Q and inverting the memory data signal Q as the reference data signal RQ. The second inverter V2 receives the memory data signal QB and inverting the memory data signal QB as the reference data signal RQB.

The SR latch L1 is coupled to the first inverter V1 and the second inverter V2, receives the reference data signals RQ and RQB and accordingly generate a first data signal D1 and a second data signal D2.

The third inverter V3 is coupled to the SR latch L1, receives the first data signal D1 and inverts the first data signal D1 as a first output data OD1 of the sense amplifier 100. The fourth inverter V4 is coupled to the SR latch L1, receives the second data signal D2 and inverts the second data signal D2 as a second output data OD2 of the sense amplifier 100, wherein the first output data OD1 of the sense amplifier 100 is complementary to the second output data OD2 of the sense amplifier 100.

The control circuit 204 includes a first switch T1, a second switch T2, a third switch T3, reference switches RT1, RT2, and an initializing element E1. The first switch T1 is coupled to the sense amplifier 100 and selectively conducted in response to the pass gate signal PGB. The second switch T2 is coupled to the first switch T1 and selectively conducted in response to a precharge signal PRE of the sense amplifier 100. The third switch T3 is coupled to a voltage source (e.g., the so-called operating voltage or VDD) and selectively conducted in response to the pass gate signal PGB.

The reference switches RT1 and RT2 are coupled to the third switch T3, wherein the reference switches RT1 and RT2 respectively corresponds to the reference data signals RQ and RQB, and each of the reference switches RT1 and RT2 is conducted in response to the corresponding reference data signals RQ and RQB. For example, the reference switch RT1 can be conducted in response to the corresponding reference data signal RQ, and the reference switch RT2 can be conducted in response to the corresponding reference data signal RQB.

In the embodiments of the disclosure, each of the considered switch can be implemented as a corresponding transistor (e.g., a PMOS/NMOS transistor)

In FIG. 4, the first switch T1 may be, for example, an NMOS transistor, wherein the first switch T1 has a first terminal, a second terminal and a control terminal. The first terminal of the first switch T1 is coupled to the sense amplifier 100, the control terminal of the first switch T1 receives the pass gate signal PGB. In one embodiment, the control device 200 provides the enable signal SAEN via the first terminal of the first switch T1.

The second switch T2 may be, for example, an NMOS transistor, wherein the second switch T2 has a first terminal, a second terminal and a control terminal. The first terminal of the second switch T2 is coupled to the second terminal of the first switch T1, the second terminal of the second switch T2 receives the precharge signal PRE, and the second terminal of the second switch T2 is coupled to a ground voltage (e.g., 0V).

The third switch T3 may be, for example, a PMOS transistor, wherein the third switch T3 has a first terminal, a second terminal and a control terminal. The first terminal of the third switch T3 is coupled to the voltage source (e.g., VDD), the control terminal of the third switch T3 is coupled to the control terminal of the first switch T1 and receives the pass gate signal PGB, the second terminal of the third switch T3 is coupled to the control terminal of the second switch T2.

The reference switch RT1 may be, for example, an NMOS transistor, wherein the reference switch RT1 has a first terminal, a second terminal and a control terminal. The first terminal of the reference switch RT1 receives the precharge signal PRE, the control terminal of the reference switch RT1 receives the reference data signal RQ, and the second terminal of the reference switch RT2 is coupled to a ground voltage. The second reference switch RT2 may be, for example, an NMOS transistor, wherein the reference switch RT2 has a first terminal, a second terminal and a control terminal. The first terminal of the reference switch RT2 receives the precharge signal PRE, the control terminal of the reference switch RT2 receives the reference data signal RQB, and the second terminal of the reference switch RT2 is coupled to the ground voltage.

The initializing element E1 is coupled to the third switch T3 and discharges the precharge signal PRE to a ground voltage level (e.g., 0V) in an initial phase PH0 of the control device 200. In FIG. 4, the initializing element E1 is a specific switch (e.g., an NMOS transistor) having a first terminal, a second terminal, and a control terminal, wherein the first terminal of the specific switch is coupled to the precharge signal PRE, the control terminal of the specific switch receives an initializing signal ACT, the second terminal of the specific switch is coupled to the ground voltage, and the specific switch is conducted in response to the initializing signal ACT in the initial phase of the control device 100.

In the embodiments of the disclosure, the operating mechanism of the sense amplifier 100 and/or the control device 200 can be understood as sequentially including the initial phase PH0, the voltage developing phase PH1, and the sensing period PH2.

In the initial phase PH0, the initializing signal ACT can be, for example, high to conduct the initializing element E1, such that the precharge signal PRE can be coupled to the ground voltage and discharged to the ground voltage level, which turns off the second switch T2. In this case, no enable signal SAEN would be provided to the sense amplifier 100 due to the unconducted second switch T2. After discharging the precharge signal to the ground voltage, the initializing element E1 can be turned off by the initializing signal ACT.

In addition, since the precharge signal PRE is low, the memory data signals Q and QB in the can be precharged to VDD. In the embodiment, the pass gate signal PGB can be high in the initial phase PH0, such that the data lines DL and DLB would not be coupled to the corresponding memory data signals Q and QB.

At the beginning of the voltage developing phase PH1, the pass gate signal PGB and the precharge signal PRE can be respectively adjusted to be, for example, low and high, such that the memory data signals Q and QB in the sense amplifier 100 can be varied in response to the voltages on the data lines DL and DLB. Meanwhile, the first switch T1 can be off (i.e., not conducted) based on the pass gate signal PGB being low, such that no enable signal SAEN would be provided to the sense amplifier 100, even though the second switch T2 is turned on by the precharge signal PRE.

In the voltage developing phase PH1, since the memory data signals Q and QB had been precharged to VDD, the memory data signals Q and QB would be determined by the latch circuit 202 as high voltage state or logic 1, even though one of the memory data signals Q and QB is gradually decreased during the voltage developing phase PH1. Therefore, the reference data signals RQ and RQB, which are respectively the inversion of the memory data signals Q and QB, would be determined to be low voltage state or logic 0, such that the reference switches RT1 and RT2 would be off.

In one embodiment, the pass gate signal PGB can be adjusted to be, for example, high to start the sensing period PH2 of the sense amplifier 100. More specifically, after the pass gate signal PGB is adjusted to be high, the first switch T1 would be turned on. Since the second switch T2 is already on due to the precharge signal PRE, the sense amplifier 100 can be coupled to the ground voltage, which can be understood as the control device 200 starts to provide the enable signal SAEN to the sense amplifier 100 for starting the sensing period PH2.

In this case, the small signal difference between the memory data signals Q and QB would be increased by the amplification of the sense amplifier 100 during the sensing period PH2, and one of the memory data signals Q and QB would reach the first voltage state by the amplification of the sense amplifier 100.

In one embodiment, if the memory data signal Q is the one reaching the first voltage state (i.e., low voltage state or logic 0) in response to the amplification of the sense amplifier 100, the first inverter V1 would accordingly invert the memory data signal Q as the reference memory data signal RQ in the second voltage state (i.e., high voltage state or logic 1). In this case, the reference switch RT1 would be turned on (i.e., conducted) by the reference memory data signal RQ in the second voltage state, such that the precharge signal PRE is coupled to the ground voltage. Accordingly, the precharge signal PRE would be discharged to the ground voltage level (e.g., 0V), and the second switch T2 would be correspondingly turned off. In this case, the sense amplifier 100 would no longer be coupled to the ground voltage, which can be understood as the control device 200 stops providing the enable signal SAEN to the sense amplifier 100, and the sensing period PH2 can be accordingly terminated.

In another embodiment, if the memory data signal QB is the one reaching the first voltage state (i.e., low voltage state or logic 0) in response to the amplification of the sense amplifier 100, the second inverter V2 would accordingly invert the memory data signal QB as the reference memory data signal RQB in the second voltage state (i.e., high voltage state or logic 1). In this case, the reference switch RT2 would be turned on (i.e., conducted) by the reference memory data signal RQB in the second voltage state, such that the precharge signal PRE is coupled to the ground voltage. Accordingly, the precharge signal PRE would be discharged to the ground voltage level (e.g., 0V), and the second switch T2 would be correspondingly turned off. In this case, the sense amplifier 100 would no longer be coupled to the ground voltage, which can be understood as the control device 200 stops providing the enable signal SAEN to the sense amplifier 100, and the sensing period PH2 can be accordingly terminated.

In one embodiment, after the sensing period PH2 is finished, the data lines DL and DLB of the sense amplifier 100 can be connected to the bit lines BL and BLB of another to-be-read memory cell. In this case, the sense amplifier 100 and the control device 200 can be configured to experience the initial phase PH0, the voltage developing phase PH1, and the sensing period PH2 again for reading the data of the another to-be-read memory cell, and the sensing period PH2 can be automatically terminated by the control device 200 again based on the teachings in the above, such that the sense amplifier 100 can be used to read the data of another memory cell with a better efficiency and speed.

Figure 5:
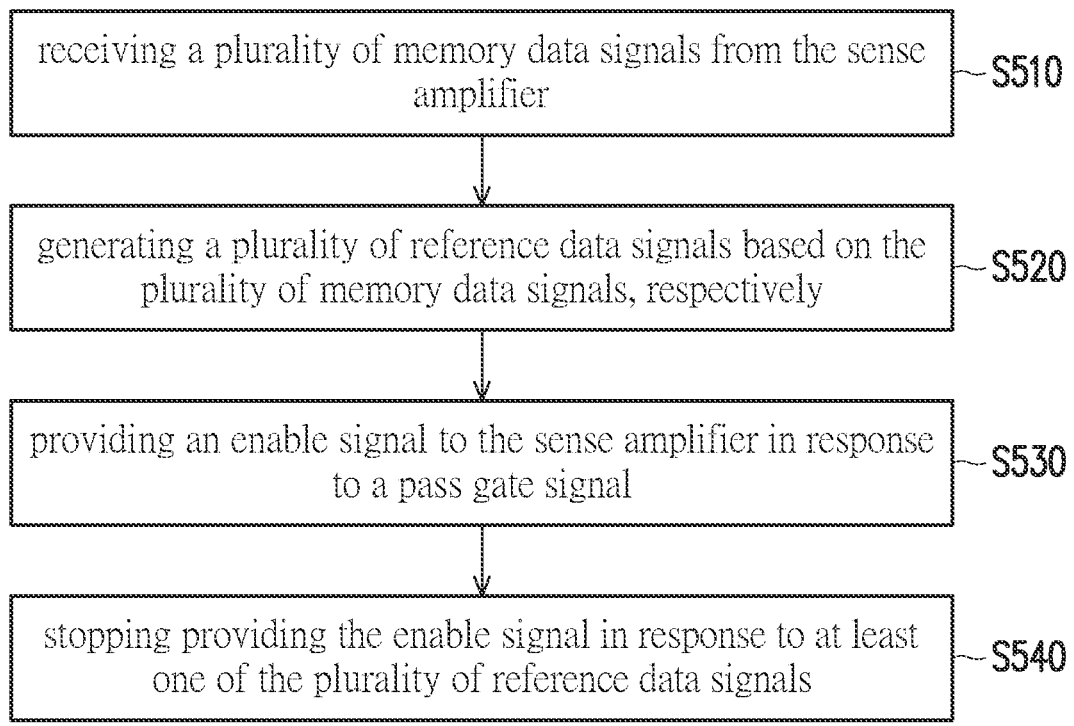
FIG. 5 shows a flow chart of the method for controlling a sense amplifier according to an embodiment of the disclosure.

See FIG. 5, which shows a flow chart of the method for controlling a sense amplifier according to an embodiment of the disclosure. In the embodiment, the steps in FIG. 5 can be implemented by the control device 200 of the disclosure.

In step S510, the latch circuit 202 receives a plurality of memory data signals Q and QB from the sense amplifier 100. In step S520, the latch circuit 202 generates a plurality of reference data signals RQ and RQB based on the plurality of memory data signals Q and QB, respectively. In step S530, the control circuit 204 provides an enable signal SAEN to the sense amplifier 100 in response to a pass gate signal PGB. In step S540, the control circuit 204 stops providing the enable signal SAEN in response to at least one of the plurality of reference data signals RQ and RQB. Details of the steps S510 to S540 can be referred to the teachings in the above, which would not be repeated herein.

In various embodiments, the control device 200 provided by the disclosure can be used with various types of sense amplifiers, such as a voltage sense amplifier and/or a current sense amplifier, but not limited to the sense amplifier 100 in FIG. 3 and FIG. 4.

In summary, the embodiments of the disclosure provide the control device for controlling the sense amplifier, wherein the provided control device can automatically terminate the sensing period when the memory data signals in the sense amplifier are suitable to be latched as the output data. Therefore, the speed and efficiency of reading memory cells can be improved.

In accordance with some embodiments, a control device for controlling a sense amplifier is introduced. The control device includes a latch circuit and a control circuit. The latch circuit receives a plurality of memory data signals from the sense amplifier, wherein the latch circuit respectively generates a plurality of reference data signals based on the plurality of memory data signals. The control circuit is coupled to the latch circuit, provides an enable signal to the sense amplifier in response to a pass gate signal of the sense amplifier, and stops providing the enable signal in response to at least one of the plurality of reference data signals, wherein the enable signal controls a sensing period of the sense amplifier.

In accordance with some embodiments, a control device for controlling a sense amplifier is introduced. The control device includes a latch circuit and a control circuit. The latch circuit receives a plurality of memory data signals from the sense amplifier, wherein the latch circuit respectively generates a plurality of reference data signals based on the plurality of memory data signals. The control circuit is coupled to the latch circuit, provides an enable signal to the sense amplifier in response to a pass gate signal of the sense amplifier, and stops providing the enable signal in response to at least one of the plurality of reference data signals, wherein the enable signal controls a sensing period of the sense amplifier. The plurality of memory data signals comprise a first memory data signal and a second memory data signal complementary to the first memory data signal, the plurality of reference data signals comprise a first reference data signal inverted to the first memory data signal and a second reference data signal inverted to the second memory data signal. The control circuit includes a first switch, a second switch, a third switch, and a plurality of reference switches. The first switch is coupled to the sense amplifier and selectively conducted in response to the pass gate signal. The second switch is coupled to the first switch and selectively conducted in response to a precharge signal of the sense amplifier. The third switch is coupled to a voltage source and selectively conducted in response to the pass gate signal. The plurality of reference switches are coupled to the third switch, wherein the plurality of reference switches respectively corresponds to the plurality of reference data signals, and each of the reference switches is conducted in response to the corresponding reference data signals.

In accordance with some embodiments, a method for controlling a sense amplifier, adapted to a control device coupled to the sense amplifier, is introduced. The method includes: receiving, by a latch circuit, a plurality of memory data signals from the sense amplifier; generating, by the latch circuit, a plurality of reference data signals based on the plurality of memory data signals, respectively; providing, by a control circuit, an enable signal to the sense amplifier in response to a pass gate signal; and stopping, by the control circuit, providing the enable signal in response to at least one of the plurality of reference data signals, wherein the enable signal controls a sensing period of the sense amplifier.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A control device for controlling a sense amplifier, comprising:

a latch circuit, receiving a plurality of memory data signals from the sense amplifier, wherein the latch circuit respectively generates a plurality of reference data signals based on the plurality of memory data signals; and a control circuit, coupled to the latch circuit, providing an enable signal to the sense amplifier in response to a pass gate signal of the sense amplifier, and stops providing the enable signal in response to at least one of the plurality of reference data signals, wherein the enable signal controls a sensing period of the sense amplifier.

2. The control device according to claim 1, wherein the plurality of memory data signals comprise a first memory data signal and a second memory data signal complementary to the first memory data signal, the plurality of reference data signals comprise a first reference data signal inverted to the first memory data signal and a second reference data signal inverted to the second memory data signal.

3. The control circuit according to claim 2, wherein the latch circuit comprises:
 a first inverter, receiving the first memory data signal and inverting the first memory data signal as the first reference data signal;
 a second inverter, receiving the second memory data signal and inverting the second memory data signal as the second reference data signal;
 an SR latch, coupled to the first inverter and the second inverter, receiving the first reference data signal and the second reference data signal and accordingly generate a first data signal and a second data signal;
 a third inverter, coupled to the SR latch, receiving the first data signal and inverting the first data signal as a first output data of the sense amplifier; and
 a fourth inverter, coupled to the SR latch, receiving the second data signal and inverting the second data signal as a second output data of the sense amplifier, wherein the first output data of the sense amplifier is complementary to the second output data of the sense amplifier.

4. The control circuit according to claim 1, wherein the control circuit comprises:
 a first switch, coupled to the sense amplifier and selectively conducted in response to the pass gate signal;
 a second switch, coupled to the first switch and selectively conducted in response to a precharge signal of the sense amplifier;
 a third switch, coupled to a voltage source and selectively conducted in response to the pass gate signal; and
 a plurality of reference switches, coupled to the third switch, wherein the plurality of reference switches respectively corresponds to the plurality of reference data signals, and each of the reference switches is conducted in response to the corresponding reference data signals.

5. The control circuit according to claim 4, wherein control circuit further comprises:
 an initializing element, coupled to the third switch, discharging the precharge signal to a ground voltage level in an initial phase of the control device.

6. The control circuit according to claim 5, wherein the initializing element is a specific switch having a first terminal, a second terminal, and a control terminal, wherein the first terminal of the specific switch is coupled to the precharge signal, the control terminal of the specific switch receives an initializing signal, the second terminal of the specific switch is coupled to a ground voltage, and the specific switch is conducted in response to the initializing signal in the initial phase of the control device.

7. The control circuit according to claim 4, wherein:
 the first switch has a first terminal, a second terminal and a control terminal, wherein the first terminal of the first switch is coupled to the sense amplifier, the control terminal of the first switch receives the pass gate signal;
 the second switch has a first terminal, a second terminal and a control terminal, wherein the first terminal of the second switch is coupled to the second terminal of the first switch, the second terminal of the second switch receives the precharge signal, and the second terminal of the second switch is coupled to a ground voltage;
 the third switch has a first terminal, a second terminal and a control terminal, wherein the first terminal of the third switch is coupled to the voltage source, the control terminal of the third switch is coupled to the control terminal of the first switch and receives the pass gate signal, the second terminal of the third switch is coupled to the control terminal of the second switch.

8. The control circuit according to claim 4, wherein the plurality of reference data signals comprise a first reference data signal and a second reference data signal, and the plurality of reference switches comprise:
 a first reference switch, having a first terminal, a second terminal and a control terminal, wherein the first terminal of the first reference switch receives the precharge signal, the control terminal of the first reference switch receives the first reference data signal, and the second terminal of the first reference switch is coupled to a ground voltage; and
 a second reference switch, having a first terminal, a second terminal and a control terminal, wherein the first terminal of the second reference switch receives the precharge signal, the control terminal of the second reference switch receives the second reference data signal, and the second terminal of the second reference switch is coupled to the ground voltage.

9. The control circuit according to claim 1, wherein the pass gate signal triggers a voltage developing phase of the sense amplifier to develop voltages of the plurality of memory data signals;
 wherein the control circuit provides the enable signal to the sense amplifier at an end of the voltage developing phase, wherein a sensing period for amplifying the plurality of memory data signals occurs after the voltage developing phase;
 in response to determining that at least one of the plurality of memory data signals reaches a first voltage state in the sensing period, the latch circuit inverts the at least one of the plurality of memory data signals as the at least one of the plurality of reference data signals; and
 the control circuit stops providing the enable signal to the sense amplifier in response to the at least one of the plurality of reference data signals.

10. The control circuit according to claim 1, wherein a duration of the enable signal is equal to the sensing period of the sense amplifier.

11. A control device for controlling a sense amplifier, comprising:
 a latch circuit, receiving a plurality of memory data signals from the sense amplifier, wherein the latch circuit respectively generates a plurality of reference data signals based on the plurality of memory data signals; and
 a control circuit, coupled to the latch circuit, providing an enable signal to the sense amplifier in response to a pass gate signal of the sense amplifier, and stops providing the enable signal in response to at least one of the plurality of reference data signals, wherein the enable signal controls a sensing period of the sense amplifier;

wherein the plurality of memory data signals comprise a first memory data signal and a second memory data signal complementary to the first memory data signal, the plurality of reference data signals comprise a first reference data signal inverted to the first memory data signal and a second reference data signal inverted to the second memory data signal;

wherein the control circuit comprises:
a first switch, coupled to the sense amplifier and selectively conducted in response to the pass gate signal;
a second switch, coupled to the first switch and selectively conducted in response to a precharge signal of the sense amplifier;
a third switch, coupled to a voltage source and selectively conducted in response to the pass gate signal; and
a plurality of reference switches, coupled to the third switch, wherein the plurality of reference switches respectively corresponds to the plurality of reference data signals, and each of the reference switches is conducted in response to the corresponding reference data signals.

12. The control circuit according to claim 11, wherein the latch circuit comprises:
a first inverter, receiving the first memory data signal and inverting the first memory data signal as the first reference data signal;
a second inverter, receiving the second memory data signal and inverting the second memory data signal as the second reference data signal;
an SR latch, coupled to the first inverter and the second inverter, receiving the first reference data signal and the second reference data signal and accordingly generate a first data signal and a second data signal;
a third inverter, coupled to the SR latch, receiving the first data signal and inverting the first data signal as a first output data of the sense amplifier; and
a fourth inverter, coupled to the SR latch, receiving the second data signal and inverting the second data signal as a second output data of the sense amplifier, wherein the first output data of the sense amplifier is complementary to the second output data of the sense amplifier.

13. The control circuit according to claim 11, wherein the control circuit further comprises:
an initializing element, coupled to the third switch, discharging the precharge signal to a ground voltage level in an initial phase of the control device.

14. The control circuit according to claim 13, wherein the initializing element is a specific switch having a first terminal, a second terminal, and a control terminal, wherein the first terminal of the specific switch is coupled to the precharge signal, the control terminal of the specific switch receives an initializing signal, the second terminal of the specific switch is coupled to a ground voltage, and the specific switch is conducted in response to the initializing signal in the initial phase of the control device.

15. The control circuit according to claim 11, wherein:
the first switch has a first terminal, a second terminal and a control terminal, wherein the first terminal of the first switch is coupled to the sense amplifier, the control terminal of the first switch receives the pass gate signal;
the second switch has a first terminal, a second terminal and a control terminal, wherein the first terminal of the second switch is coupled to the second terminal of the first switch, the second terminal of the second switch receives the precharge signal, and the second terminal of the second switch is coupled to a ground voltage;
the third switch has a first terminal, a second terminal and a control terminal, wherein the first terminal of the third switch is coupled to the voltage source, the control terminal of the third switch is coupled to the control terminal of the first switch and receives the pass gate signal, the second terminal of the third switch is coupled to the control terminal of the second switch.

16. The control circuit according to claim 11, wherein the plurality of reference data signals comprise a first reference data signal and a second reference data signal, and the plurality of reference switches comprise:
a first reference switch, having a first terminal, a second terminal and a control terminal, wherein the first terminal of the first reference switch receives the precharge signal, the control terminal of the first reference switch receives the first reference data signal, and the second terminal of the first reference switch is coupled to a ground voltage; and
a second reference switch, having a first terminal, a second terminal and a control terminal, wherein the first terminal of the second reference switch receives the precharge signal, the control terminal of the second reference receives the second reference data signal, and the second terminal of the second reference switch is coupled to the ground voltage.

17. The control circuit according to claim 11, wherein the pass gate signal triggers a voltage developing phase of the sense amplifier to develop voltages of the plurality of memory data signals;
wherein the control circuit provides the enable signal to the sense amplifier at an end of the voltage developing phase, wherein a sensing period for amplifying the plurality of memory data signals occurs after the voltage developing phase;
in response to determining that at least one of the plurality of memory data signals reaches a first voltage state in the sensing period, the latch circuit inverts the at least one of the plurality of memory data signals as the at least one of the plurality of reference data signals; and
the control circuit stops providing the enable signal to the sense amplifier in response to the at least one of the plurality of reference data signals.

* * * * *